United States Patent
Ono et al.

(10) Patent No.: US 8,248,587 B2
(45) Date of Patent: Aug. 21, 2012

(54) TESTING METHOD OF SEMICONDUCTOR LASER AND LASER TESTING DEVICE

(75) Inventors: Haruyoshi Ono, Kanagawa (JP); Isao Baba, Kanagawa (JP); Makoto Sugiyama, Kanagawa (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 182 days.

(21) Appl. No.: 12/726,015

(22) Filed: Mar. 17, 2010

(65) Prior Publication Data

US 2010/0238426 A1  Sep. 23, 2010

(30) Foreign Application Priority Data

Mar. 17, 2009 (JP) .................................. 2009-064863

(51) Int. Cl.
*G01J 3/00* (2006.01)
(52) U.S. Cl. ......................................................... 356/51
(58) Field of Classification Search .................... 356/51, 356/73.1
See application file for complete search history.

(56) References Cited

U.S. PATENT DOCUMENTS

| 5,552,881 A | * | 9/1996 | Jezwinski et al. | ........... 356/73.1 |
| 2008/0165348 A1 | * | 7/2008 | Kim et al. | ..................... 356/73.1 |

FOREIGN PATENT DOCUMENTS

JP  1-204491 A  8/1989

* cited by examiner

*Primary Examiner* — Michael P Stafira
(74) *Attorney, Agent, or Firm* — Westerman, Hattori, Daniels & Adrian, LLP

(57) ABSTRACT

A testing method of a semiconductor laser emitting a wavelength under a test different from a reference wavelength in a given wavelength range includes: a first step of obtaining a length of an optical fiber under the test satisfying a reference dispersion condition at the wavelength under the test, based on the reference dispersion condition for the test and a unit dispersion amount of the optical fiber; and a second step of inputting a modulation signal that is a modulated laser light of the semiconductor laser having a wavelength as the wavelength under the test into an optical fiber having substantially the same length as the length obtained in the first step and evaluating an output of the optical fiber.

9 Claims, 5 Drawing Sheets

TESTING METHOD OF SEMICONDUCTOR LASER AND LASER TESTING DEVICE

CROSS-REFERENCE TO RELATED APPLICATION

This application is based upon and claims the benefit of priority of the prior Japanese Patent Application No. 2009-064863, filed on Mar. 17, 2009, the entire contents of which are incorporated herein by reference.

BACKGROUND (i) Technical Field

The present invention relates to a testing method of a semiconductor laser and a laser testing device.

(ii) Related Art

FIG. 1 illustrates a block diagram of a laser testing device for measuring a bit error rate that is one of transmission property tests of a modulation signal. As illustrated in FIG. 1, a laser device 101 is coupled to a light-receiving device 103 through an optical fiber 102 and a variable attenuator 107.

A controller 104 includes a pattern generator 105 and an evaluation unit 106. The pattern generator 105 inputs a given test data pattern into the laser device 101. Then, the laser device 101 outputs an optical signal according to the test data pattern. The optical signal gets to the light-receiving device 103 through an optical fiber 102 having a given length. The evaluation unit 106 evaluates data of the optical signal obtained through a through line in synchronization with the output data of the pattern generator 105 with use of an electrical signal from the light-receiving device 103. And, the controller 104 controls attenuation amount of the variable attenuator 107.

The laser testing device evaluates degradation (bit error rate) of an optical signal getting to the light-receiving device 103 with respect to the changing of the attenuation amount of the variable attenuator 107, and determines the laser device 101 as defective or non-defective. For example, Japanese Patent Application Publication No. 1-204491 discloses the above-mentioned laser testing device.

SUMMARY

In general, the optical fiber 102 having a given transmission dispersion amount is provided when a bit error rate or an eye pattern of a laid optical fiber is tested. A variety of laser light having different wavelength around a reference wavelength is used in a wavelength multiplexing communication such as WDM (Wavelength Division Multiplexing).

However, the same optical fiber 102 is used with respect to any type of laser device in the bit error rate test or in the eye pattern test. Therefore, the dispersion amount of the optical fiber is not considered.

For example, dispersion amount of laser light having passed through the optical fiber 102 is enlarged when the laser device outputs a wavelength longer than a reference wavelength of a dispersion amount of the optical fiber 102. Therefore, the bit error rate or the eye pattern is evaluated with use of a standard harder than a predetermined transmission dispersion amount when the laser device outputs a wavelength longer than the reference wavelength of the dispersion amount of the optical fiber 102. Therefore, a non-defective product may be determined as "defective".

The dispersion amount of laser light having passed through the optical fiber 102 is reduced when the laser device outputs a wavelength shorter than a reference wavelength of the dispersion amount of the optical fiber 102. Therefore, the bit error rate or the eye pattern is evaluated with use of a standard lighter than a predetermined transmission dispersion amount when the laser device outputs a wavelength shorter than the reference wavelength of the dispersion amount of the optical fiber 102. Therefore, a defective product may be determined as "non-defective".

It is an object of the present invention to provide a laser testing method and a laser testing device capable of evaluating data transmission property accurately.

According to an aspect of the present invention, there is provided a testing method of a semiconductor laser emitting a wavelength under a test different from a reference wavelength in a given wavelength range, including: a first step of obtaining a length of an optical fiber under the test satisfying a reference dispersion condition at the wavelength under the test, based on the reference dispersion condition for the test and a unit dispersion amount of the optical fiber; and a second step of inputting a modulation signal that is a modulated laser light of the semiconductor laser having a wavelength as the wavelength under the test into an optical fiber having substantially the same length as the length obtained in the first step and evaluating an output of the optical fiber.

According to an aspect of the present invention, there is provided a laser testing device including: an optical fiber unit that selects a length of an optical fiber based on information relating to a wavelength of laser light under a test; and an evaluation unit that receives modulated laser light and evaluates an optical signal from the optical fiber with respect to the optical fiber having the length selected by the optical fiber unit.

DETAILED DESCRIPTION

First Embodiment

Figure 1:
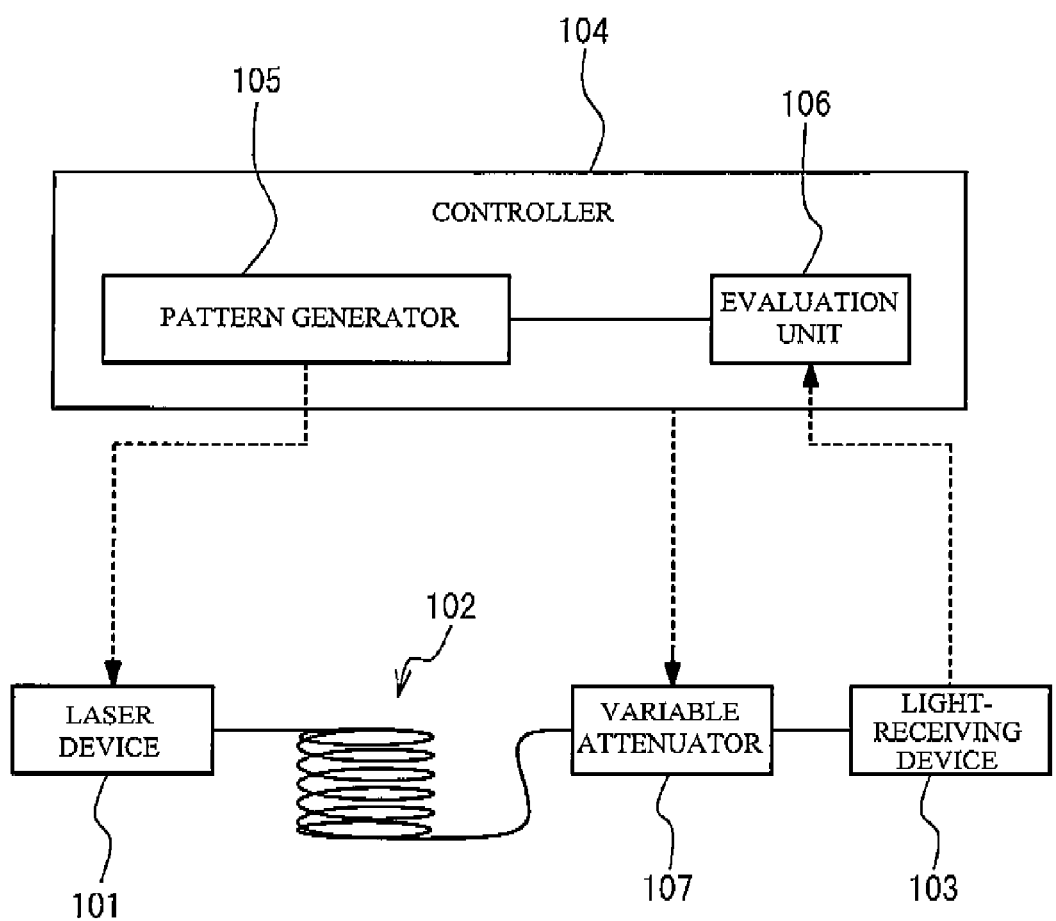
FIG. 1 illustrates a block diagram of a laser testing device for measuring a bit error rate that is one of transmission property tests of a modulation signal.
Figure 2:
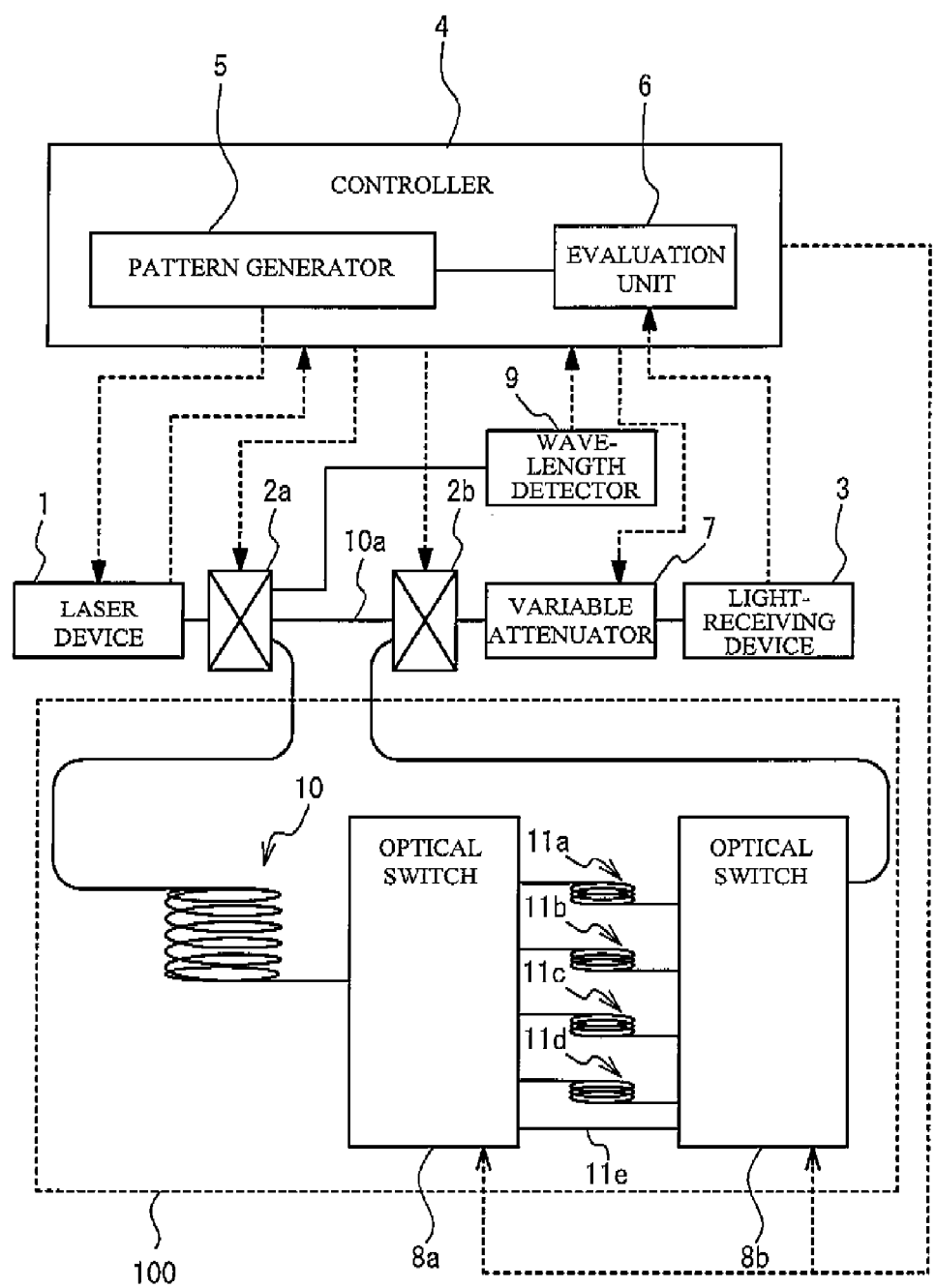
FIG. 2 illustrates a block diagram of a laser testing device in accordance with a first embodiment.

FIG. 2 illustrates a block diagram of a laser testing device in accordance with a first embodiment. As illustrated in FIG. 2, the laser testing device includes a laser device 1, a light-receiving device 3, a controller 4, a variable attenuator 7 and an optical fiber unit 100.

The laser device 1 is a modulable laser device. The laser device 1 is coupled to the light-receiving device 3 through optical switches 2a and 2b, a through line 10a, the optical fiber unit 100 and the variable attenuator 7.

The optical fiber unit 100 includes a main optical fiber 10, optical switches 8a and 8b, and a plurality of sub optical fibers 11a to 11e. The main optical fiber 10 has, for example, shortest fiber length according to a desirable supposed dispersion, and is coupled between the laser device 1 and the optical switch 8a. The sub optical fibers 11a to 11e are coupled between the optical switch 8a and the optical switch 8b. The optical switch 8b is coupled to the variable attenuator 7. The optical switches 8a and 8b select one of the sub optical fibers 11a to 11e. Thus, an optical fiber length from the laser device 1 to the variable attenuator 7 is selected. The sub optical fiber 11e is a through line and has a short fiber length. In FIG. 2, five kinds of sub optical fibers are provided. However, more than one sub optical fiber has only to be provided.

The variable attenuator 7 is an attenuator adjusting attenuation amount of a light from the optical fiber unit 100. The light-receiving device 3 includes a photo diode and so on, and receives a light having passed through the variable attenuator 7. A wavelength detector 9 detects a wavelength output from the laser device 1. The controller 4 includes a CPU (Central Processing Unit), a ROM (Read Only Memory), a RAM (Random Access Memory) and so on. The CPU executes a given program and acts as a pattern generator 5 and an evaluation unit 6 in the controller 4.

Figure 3:
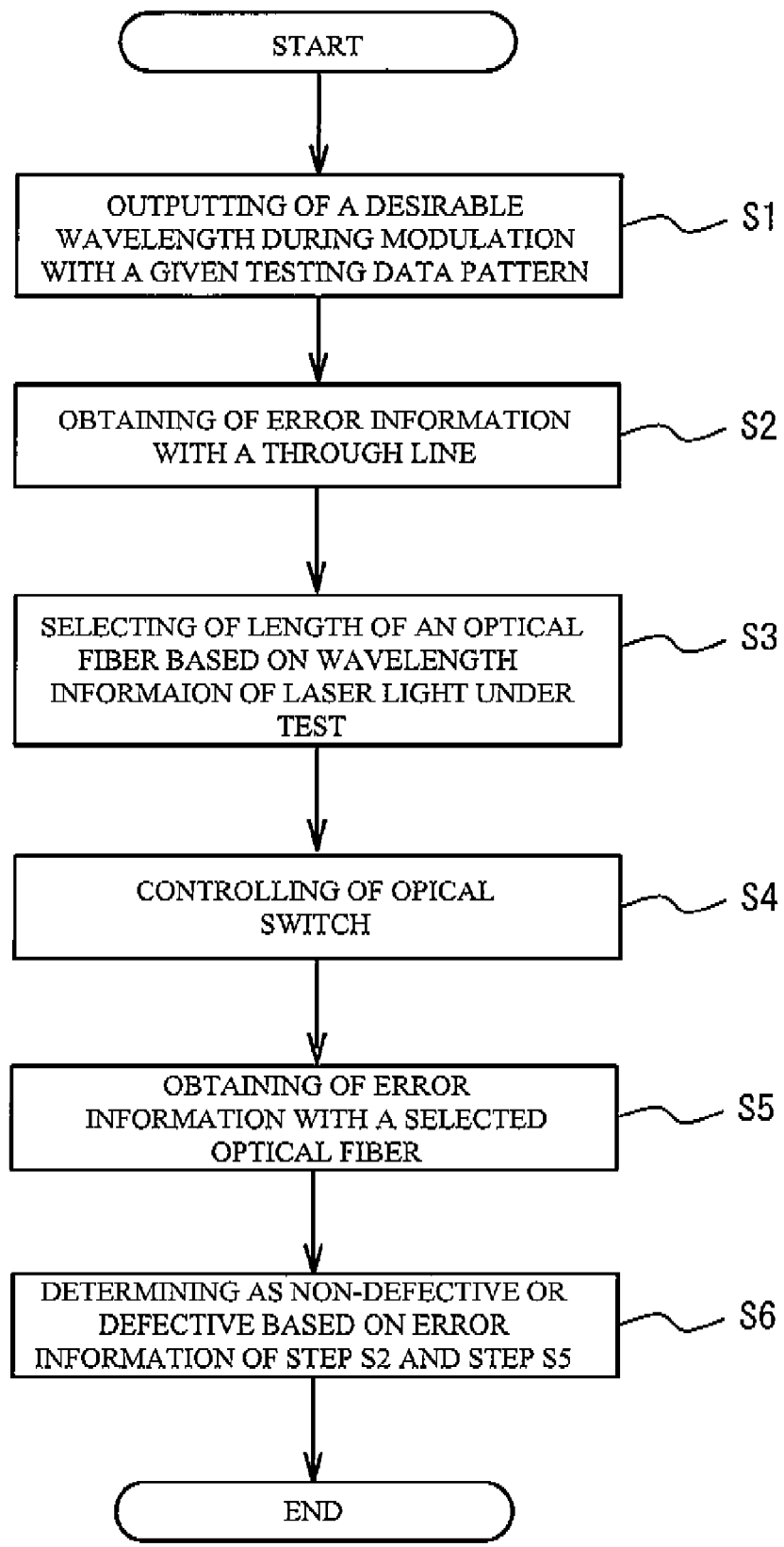
FIG. 3 illustrates an example of a flow chart executed by the controller.

Next, a description will be given of an operation of the laser testing device in accordance with the embodiment. FIG. 3 illustrates an example of a flow chart executed by the controller 4. A description will be given of the operation of the laser testing device with reference to FIG. 2 and FIG. 3. As illustrated in FIG. 3, the pattern generator 5 inputs a given testing data pattern into the laser device 1. Thus, the laser device 101 outputs an optical signal according to the testing data pattern. At the moment, the optical switch 2a couples an optical path to the wavelength detector 9. An output wavelength of the laser device 101 is controlled so that a desirable wavelength (a wavelength under test) is obtained (Step S1).

Here, information relating to the wavelength of the laser device 1 is not limited. For example, the information may be a measured value of the output wavelength of the laser device 1 controlled in Step S1, or information relating to an output wavelength of the laser device 1 obtained in advance.

Next, the controller 4 controls the optical switches 2a and 2b so that the light-receiving device 3 receives the output of the laser device 1 through the through line 10a and the variable attenuator 7. The testing data pattern of Step S1 is continuously fed into the laser device 1. An electrical signal generated in the light-receiving device 3 is fed into the evaluation unit 6. The evaluation unit 6 evaluates the electrical signal from the light-receiving device 3 in synchronization with the output data of the pattern generator 5. Every attenuation amount given by the variable attenuator 7 is evaluated. Thus, error information including degradation of the optical signal getting to the light-receiving device 3 with each attenuation amount is obtained (Step S2).

Next, the controller 4 selects a length of an optical fiber under test, based on the information relating to the output wavelength of the laser device 1 in Step S1 (Step S3). Here, a dispersion amount condition of an optical fiber affecting the laser light is provided in an evaluation of transmission property of a modulation signal. It is preferable that the dispersion condition is satisfied in order to restrain an influence on a transmission waveform. And so, the controller 4 selects the length of the optical fiber so that the dispersion condition of the optical fiber is satisfied in Step S3.

A description will be given of details of selection of the optical fiber length in a C-band range (Conventional-band: 1530 nm to 1565 nm). The controller 4 determines a coefficient of the following Equation (1) based on a difference between a reference wavelength 1550 nm of a unit dispersion amount of an optical fiber and a wavelength of the laser light under test when selecting the optical fiber length.

Optical fiber length (km)=dispersion capacity of an optical fiber (ps/nm)/unit dispersion amount with respect to an optical fiber length (ps/(nm·km))　　[Equation 1]

Generally, an optical fiber to which zero dispersion amount is set has a unit dispersion amount $D(\lambda)$ of optical fiber at a wavelength $\lambda$. Therefore, the optical fiber under transmission test of a modulation signal has only to have the optical fiber length obtained with Equation (1).

Figure 4A:
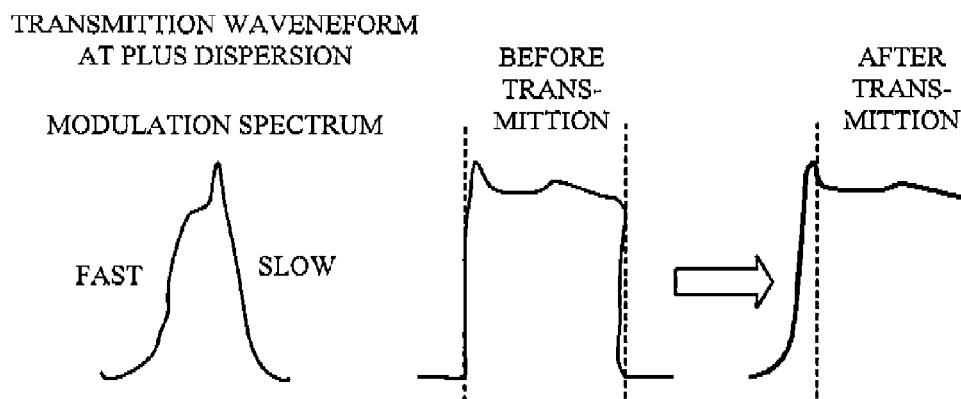
FIGS. 4A and 4B illustrate a changing of dispersion amount according to a wavelength.
Figure 4B:
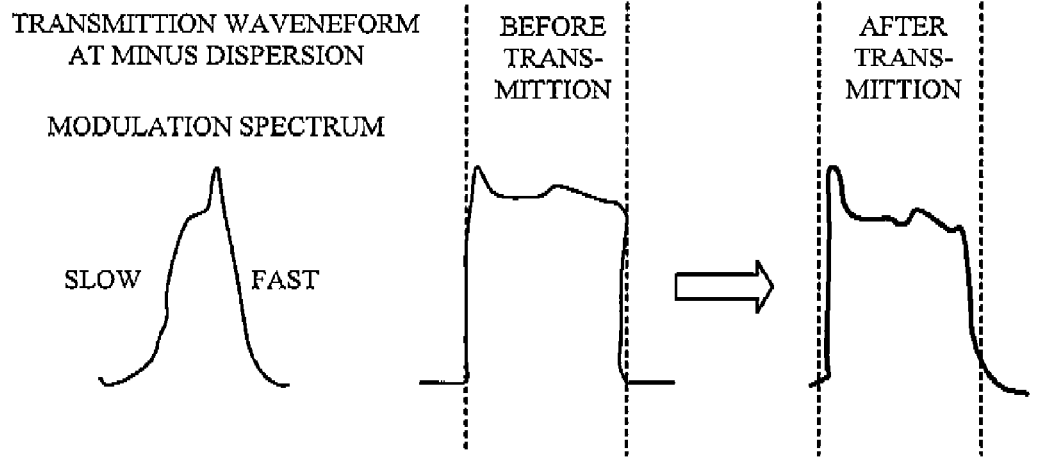

The dispersion amount increases at a longer wavelength compared to a reference wavelength and decreases at a shorter wavelength compared to the reference wavelength in the optical fiber to which the zero dispersion amount is set. In this case, as illustrated in FIGS. 4A and 4B, the transmission waveform is changed. And so, the controller 4 shortens the optical fiber length compared to a set length at longer wavelength compared to the reference wavelength so that the dispersion amount condition of the optical fiber in the transmission test of the modulation signal is satisfied.

For example, in accordance with Equation (1), the unit dispersion amount with respect to a length of an optical fiber is 16.7 ps/(nm-km) and the length of the optical fiber is 95 km when a wavelength of laser light under test is 1560 nm longer than the reference wavelength, in a case where dispersion tolerance of the optical fiber is 1600 ps/nm (International Standard regarding optical communication: ITU-G (ITU: International Telecommunication Union)).

The length of the optical fiber is long compared to a set length, if the wavelength of the laser light is shorter than the reference wavelength. For example, the length of the optical fiber is set to be 110 km, if the wavelength of the laser light under test is 1520 nm shorter than the reference wavelength. It is possible to select the length of the optical fiber in S-band range (Short-hand: 1460 nm to 1530 nm) or L-band range (Long-band: 1565 nm to 1625 nm) as well as the above-mentioned C-band range.

The calculation method of a length of an optical fiber is changed according to a relationship between an optical fiber condition under modulation transmission test and wavelength of laser light under test. For example, a description will be given of a case where modulation transmission of laser light having wavelength around 1300 nm in an optical fiber having zero dispersion amount at 1300 nm wavelength is tested. In this case, it is necessary to consider that the dispersion amount is zero at 1300 nm wavelength, if the modulation transmission of the laser light around 1300 nm is tested in the optical fiber in which zero dispersion amount is set at 1300 nm. In this case, the dispersion amount increases when the wavelength gets away from 1300 nm toward both longer side and shorter side. Therefore, a coefficient for shortening the length of the optical fiber is selected in the selection even if the wavelength gets away from the center wavelength (1300 nm) toward both longer side and shorter side. The unit dispersion amount when the reference wavelength is 1550 nm is 16.7 ps/(nm·km) in the optical fiber in which zero dispersion amount is set at 1300 nm.

Next, the controller 4 controls the optical switches 2a and 2b so as to select the length of the optical fiber selected in Step S3 (Step S4). Next, the controller 4 controls the optical switches 2a and 2b so that the light-receiving device 3 receives the output of the laser device 1 through the optical fiber unit 100 and the variable attenuator 7. The laser device 1 continuously receives the testing data pattern of Step S1. The evaluation unit 6 receives an electrical signal generated in the light-receiving device 3. The evaluation unit 6 obtains error information in which degradation (bit error) of the optical signal fed into the light-receiving device 3 is collected per attenuation amount (Step S5).

Next, the evaluation unit 6 compares the error information obtained in Step S2 (error having passed through the through line 10a) and the error information obtained in Step S5 (error information having passed through the optical fiber unit 100). And the evaluation unit 6 determines the laser device 1 as non-defective or defective (Step S6). After that, the controller 4 completes the flowchart.

In accordance with the embodiment, a length of an optical fiber having adequate dispersion amount is selected according to a wavelength of laser light under test. This allows adequate evaluation of a transmission waveform. Therefore, data transmission property is evaluated adequately. The evaluation of the data transmission property may be what is called eye pattern evaluation as well as the bit error evaluation of the embodiment.

Figure 5:
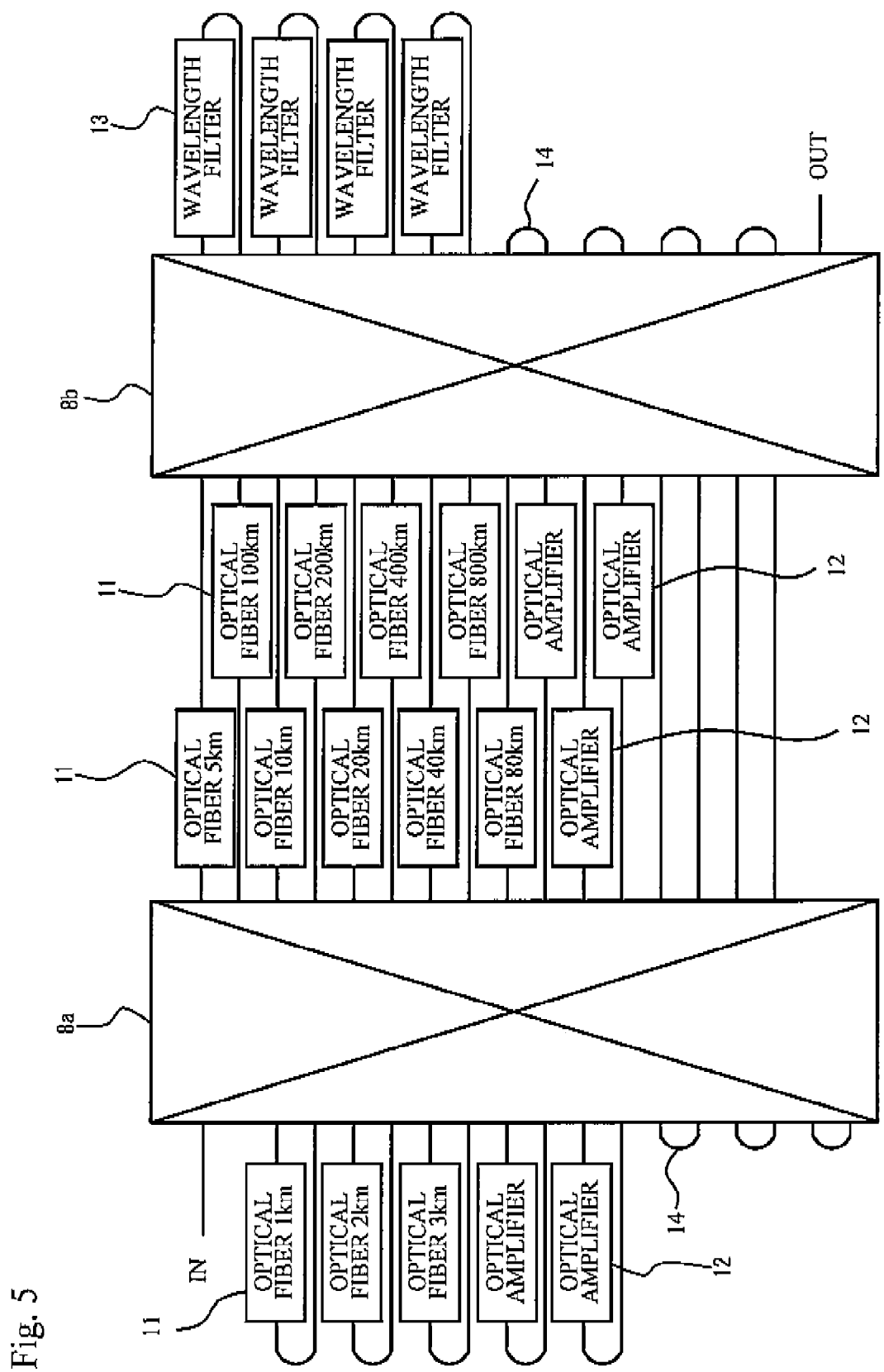
FIG. 5 illustrates another example of an optical switch and a sub optical fiber.

In the optical fiber unit 100 illustrated in FIG. 2, the optical switches 8a and 8b select one of the sub optical fibers 11a to 11d as a pathway. However, the selection of the pathway is not limited. For example, the optical switches 8a and 8b may select the pathway by combining a plurality of the sub optical fibers. FIG. 5 illustrates another example of an optical switch and a sub optical fiber.

As illustrated in FIG. 5, each of the sub optical fibers 11 is an optical fiber having different length. The optical switches 8a and 8b are capable of selecting an optical fiber having desirable length by combining at least one of the sub optical fibers 11. A return fiber 14 connects an input/output ports of the switched 8a and 8b. The return fiber 14 and the optical switches 8a and 8b may couple a plurality of the sub optical fibers 11 each other. Thus, an optical fiber having arbitrary length can be selected. The optical switches 8a and 8b may let an optical amplifier 12 in the optical fiber in which a plurality of the sub optical fibers 11 are combined, when the optical fiber has a length larger than a predetermined length. The optical amplifier 12 amplifies attenuated optical power caused long distance transmission. The optical switches 8a and 8b may let a wavelength filter 13 in the optical fiber. The wavelength filter 13 removes noise-level light.

The present invention is not limited to the specifically disclosed embodiments and variations but may include other embodiments and variations without departing from the scope of the present invention.

What is claimed is:

1. A testing method of a semiconductor laser emitting a wavelength under a test different from a reference wavelength in a given wavelength range, comprising:
   a first step of obtaining a length of an optical fiber under the test satisfying a reference dispersion condition at the wavelength under the test, based on the reference dispersion condition for the test and a unit dispersion amount of the optical fiber; and
   a second step of inputting a modulation signal that is a modulated laser light of the semiconductor laser having a wavelength as the wavelength under the test into another optical fiber having substantially the same length as the length obtained in the first step and evaluating an output of the another optical fiber.

2. The testing method as claimed in claim 1, wherein:
   the first step includes obtaining a difference between the length of the optical fiber satisfying the reference dispersion amount condition at the wavelength under the test and a length of the optical fiber satisfying the reference dispersion amount condition at the reference wavelength; and
   the second step includes providing said another optical fiber based on information of the difference obtained in the first step.

3. The testing method as claimed in claim 1, wherein:
   in the first step, the length is set to be a length of an optical fiber shorter than a length determined so that dispersion amount condition of the reference wavelength is satisfied when the wavelength of the laser light is longer than the reference wavelength of the unit dispersion amount of the optical fiber, if the reference wavelength is 1550 nm; and
   in the first step, the length is set to be a length of an optical fiber longer than a length determined so that dispersion amount condition of the reference wavelength is satisfied when the wavelength of the laser light is shorter than the reference wavelength of the unit dispersion amount of the optical fiber, if the reference wavelength is 1550 nm.

4. The testing method as claimed in claim 1, wherein in the first step, the length is selected to a fiber length shorter than a length of an optical fiber that is determined so that dispersion amount condition of the reference wavelength is satisfied when the wavelength of the laser light is longer or shorter than the reference wavelength of the unit dispersion amount of the optical fiber, if the reference wavelength is 1300 nm.

5. The testing method as claimed in claim 1, wherein the wavelength range is 1460 nm to 1530 nm, 1530 nm to 1565 nm, or 1565 nm to 1625 nm.

6. A laser testing device comprising:
   an optical fiber unit that selects a length of an optical fiber based on information relating to a wavelength of laser light under a test; and
   an evaluation unit that receives modulated laser light and evaluates an optical signal from another optical fiber with respect to the optical fiber having the length selected by the optical fiber unit.

7. The laser testing device as claimed in claim 6, wherein the optical fiber unit includes a main optical fiber portion, a sub optical fiber portion, and a switch portion that changes a combination relation between the main optical fiber portion and the sub optical fiber portion.

8. The laser testing device as claimed in claim 7, wherein:
   the sub optical fiber portion includes a plurality of sub optical fibers; and
   the switch portion selects a combination of the sub optical fiber coupled to the main optical fiber portion.

9. The laser testing device as claimed in claim 8, wherein the plurality of the sub optical fibers are a plurality of sub optical fibers having different lengths.

* * * * *